(12) United States Patent
Jin

(10) Patent No.: US 12,406,737 B2
(45) Date of Patent: Sep. 2, 2025

(54) SEMICONDUCTOR DEVICE AND OPERATING METHOD OF SEMICONDUCTOR DEVICE

(71) Applicant: SK hynix Inc., Gyeonggi-do (KR)

(72) Inventor: Byeong Ju Jin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 210 days.

(21) Appl. No.: 18/325,132

(22) Filed: May 30, 2023

(65) Prior Publication Data
US 2024/0257882 A1  Aug. 1, 2024

(30) Foreign Application Priority Data
Jan. 26, 2023  (KR) .................. 10-2023-0010214

(51) Int. Cl.
*G11C 16/26* (2006.01)
*G11C 16/04* (2006.01)
*G11C 16/24* (2006.01)

(52) U.S. Cl.
CPC .......... *G11C 16/26* (2013.01); *G11C 16/0433* (2013.01); *G11C 16/24* (2013.01)

(58) Field of Classification Search
CPC ...... G11C 16/26; G11C 16/0433; G11C 16/24
See application file for complete search history.

(56) References Cited

U.S. PATENT DOCUMENTS

| 8,441,853 | B2* | 5/2013 | Li | G11C 11/5642 365/185.05 |
|---|---|---|---|---|
| 11,270,777 | B2 | 3/2022 | Chen et al. | |
| 2012/0081964 | A1* | 4/2012 | Li | G11C 16/3436 365/185.21 |
| 2014/0286099 | A1* | 9/2014 | Shirakawa | G11C 29/82 365/185.12 |
| 2015/0262682 | A1* | 9/2015 | Futatsuyama | G11C 16/10 365/185.18 |
| 2016/0078953 | A1* | 3/2016 | Bushnaq | G11C 16/26 365/185.21 |
| 2021/0020254 | A1* | 1/2021 | Kim | G11C 16/26 |
| 2021/0312957 | A1* | 10/2021 | Okabe | G11C 7/222 |
| 2022/0020436 | A1* | 1/2022 | Choi | G11C 16/3459 |
| 2022/0093183 | A1* | 3/2022 | Kim | G11C 16/3409 |
| 2022/0392539 | A1* | 12/2022 | Choi | G11C 16/3459 |
| 2024/0260264 | A1* | 8/2024 | Kwak | H10B 43/27 |
| 2024/0284670 | A1* | 8/2024 | Kwak | H10B 43/27 |

FOREIGN PATENT DOCUMENTS

| KR | 10-2014-0025164 A | 3/2014 |
|---|---|---|
| KR | 10-2020-0136750 A | 12/2020 |

* cited by examiner

*Primary Examiner* — Alexander Sofocleous
*Assistant Examiner* — Duy H Luong
(74) *Attorney, Agent, or Firm* — IP & T GROUP LLP

(57) ABSTRACT

A semiconductor device may include a bit line; memory strings connected to the bit line and having different sizes; a sensing node; and a sensing transistor that connects the bit line and the sensing node in response to a sensing signal. In an evaluation period in which the bit line and the sensing node are connected to each other, resistance of a current path between the bit line and the sensing node may be changed according to a size of a selected memory string.

20 Claims, 7 Drawing Sheets

SEMICONDUCTOR DEVICE AND OPERATING METHOD OF SEMICONDUCTOR DEVICE

CROSS-REFERENCE TO RELATED APPLICATION

This application claims priority under 35 U.S.C. § 119 to Korean Patent Application No. 10-2023-0010214 filed on Jan. 26, 2023, which is incorporated herein by reference in its entirety.

BACKGROUND

1. Technical Field

Embodiments of the present disclosure relate to an electronic device, and more particularly, to a semiconductor device and an operating method of the semiconductor device.

2. Related Art

The degree of integration of a semiconductor device is mainly determined by an area occupied by a unit memory cell. As the improvement in the degree of integration of a semiconductor device for forming memory cells in a single layer on a substrate reaches the limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment of the present disclosure, a semiconductor device may include: a bit line; memory strings connected to the bit line and having different sizes; a page buffer including at least a sensing node and a sensing transistor configured to couple the bit line and the sensing node in response to a sensing signal, wherein, during an evaluation period of the page buffer, resistance of a current path formed from the bit line to the sensing node is adjusted based on a size of a memory string selected among the memory strings.

In an embodiment of the present disclosure, a semiconductor device may include: a bit line; memory strings connected to the bit line and having different sizes; a page buffer including at least a sensing node and a sensing transistor configured to electrically connect the bit line and the sensing node in response to a sensing signal, wherein a length of an evaluation period of the page buffer, in which the bit line and the sensing node are connected to each other, is adjusted based on a size of a memory string selected among the memory strings.

In an embodiment of the present disclosure, an operating method of a semiconductor device may include: applying a read voltage to a selected word line; applying a pass voltage to unselected word lines; and turning on a sensing transistor, during an evaluation period of a page buffer, to electrically connect a sensing node and a memory string selected among memory strings connected to a bit line, wherein a turn-on voltage of the sensing transistor is adjusted based on a size of the selected memory string.

In an embodiment of the present disclosure, an operating method of a semiconductor device may include: applying a read voltage to a selected word line; applying a pass voltage to unselected word lines; and turning on a sensing transistor, during an evaluation period of a page buffer, to connect a sensing node and a memory string selected among memory strings connected to a bit line, wherein a turn-off point in time of the sensing transistor is adjusted based on a size of the selected memory string.

In an embodiment of the present disclosure, a semiconductor device may include: a bit line; memory strings connected to the bit line and having different sizes; a page buffer including at least a sensing node and a sensing transistor configured to couple the bit line and the sensing node in response to a sensing signal, wherein, during an evaluation period of the page buffer, in which a current path is formed from the bit line to the sensing node, the sensing node is charged by using different methods based on a size of a memory string selected among the memory strings.

DETAILED DESCRIPTION

Various embodiments of the present disclosure are directed to a semiconductor device having improved operational reliability and an operating method of the semiconductor device.

It is possible to provide a semiconductor device having improved operational reliability and to improve a read operation of the semiconductor device.

Hereafter, embodiments in accordance with the technical spirit of the present disclosure will be described with reference to the accompanying drawings.

In the following description, it is to be noted that only a part necessary to understand an operation according to an embodiment of the present disclosure is described and descriptions of the other parts will be omitted in order not to obscure the subject matter of the present disclosure.

Figure 1A:
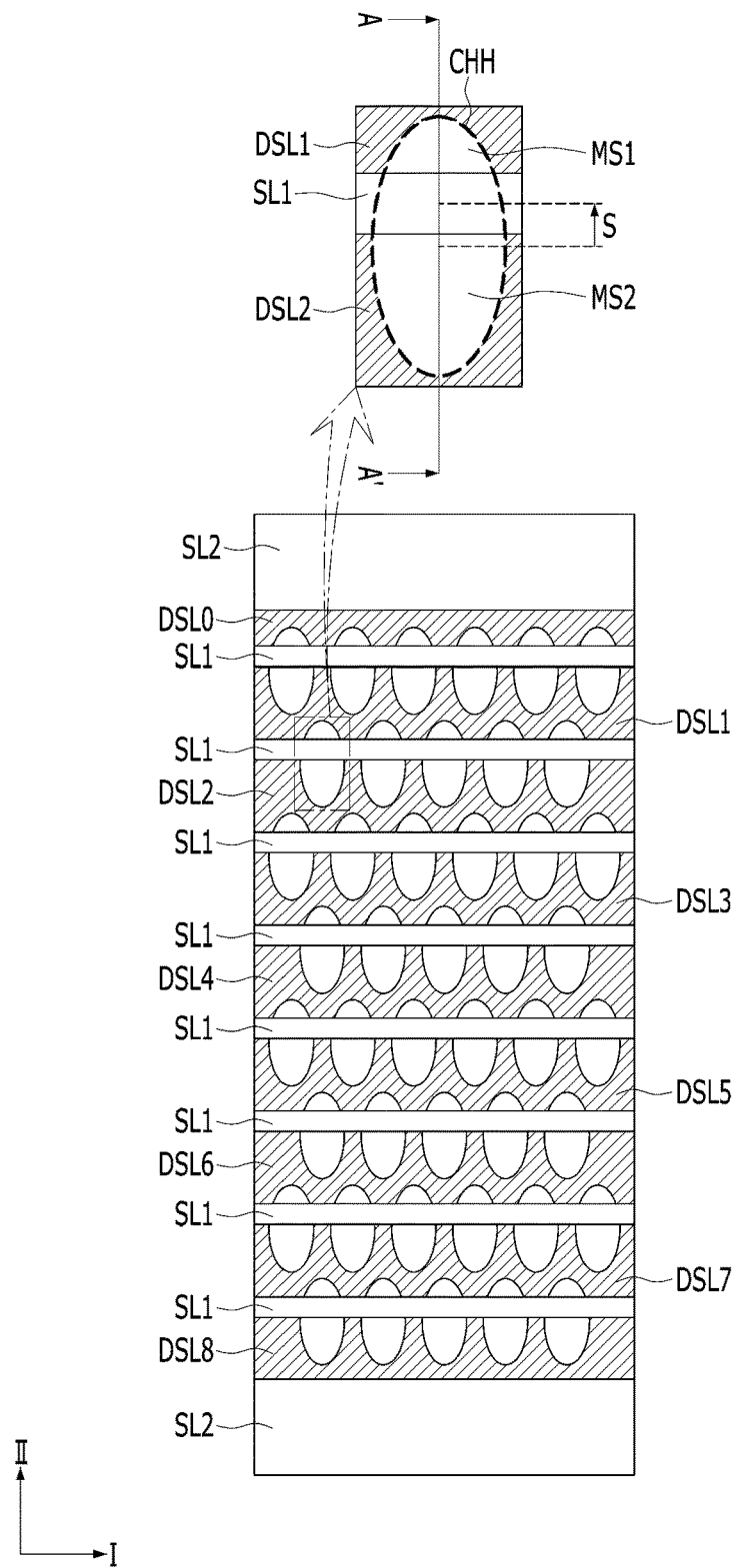
FIG. 1A and FIG. 1B are diagrams for describing a structure of a semiconductor device in accordance with an embodiment of the present disclosure.
Figure 1B:
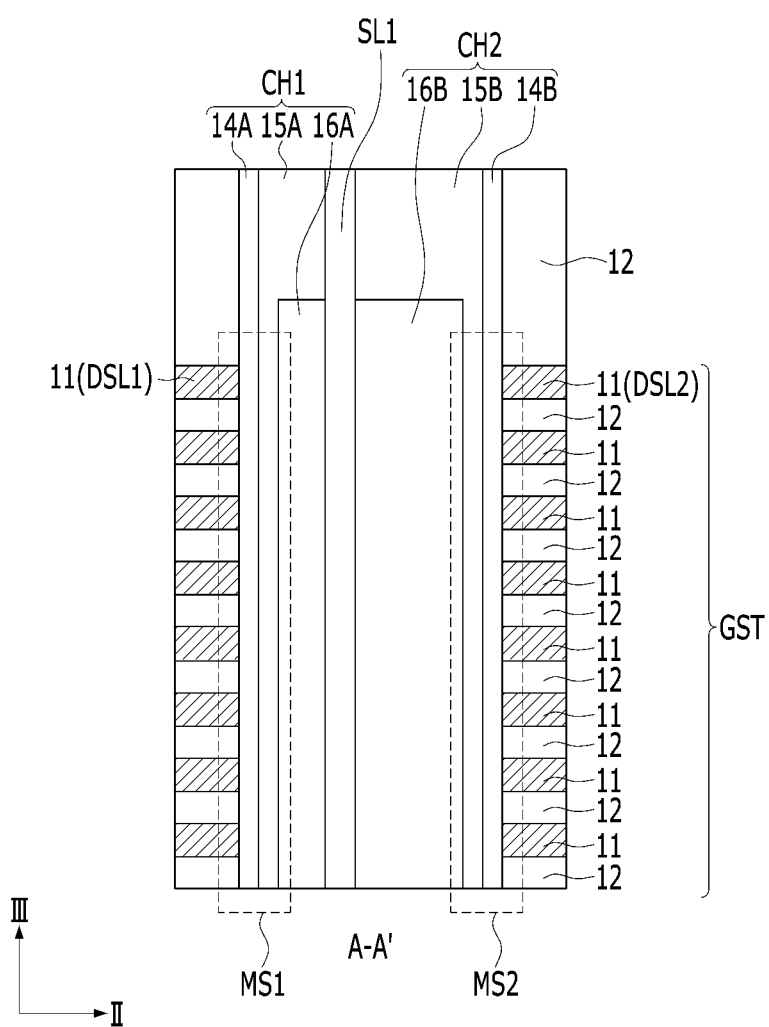

FIG. 1A and FIG. 1B are diagrams for describing a structure of a semiconductor device in accordance with an embodiment of the present disclosure.

Referring to FIG. 1A and FIG. 1B, the semiconductor device may include gate structures GST, first channel structures CH1, second channel structures CH2, and first slit structures SL1. The semiconductor device may further include second slit structures SL2.

The gate structure GST may include a plurality of conductive layers 11 and a plurality of insulating layers 12, which are alternately stacked. The conductive layers 11 may be gate lines such as word lines, select lines, and bit lines. As an example, among the conductive layers 11, at least one lowermost conductive layer 11 may be a source select line, at least one uppermost conductive layer 11 may be a drain select line (i.e., DSL0, DSL1, DSL2, DSL3, DSL4, DSL5, DSL6, DSL7, or DSL8), and the remaining conductive layers 11 may be word lines.

The gate structure GST may be located between the second slit structures SL2. In a plane defined by a first direction I and a second direction II, the second slit structures SL2 may be adjacent to each other in the second direction II and may extend in the first direction I. The gate structures GST may be isolated from each other by the second slit structures SL2. In a cross section defined by the second direction II and a third direction III, the second slit structures SL2 may extend between the gate structures GST in the third direction III. The third direction III may be orthogonal to the plane defined by the first direction I and the second direction II. The second slit structure SL2 may include a source contact structure connected to a source line, an insulating material, or a combination thereof.

The first channel structure CH1 and the second channel structure CH2 may be located in the gate structure GST. In the cross section defined by the second direction II and the third direction III, the first channel structure CH1 and the second channel structure CH2 may extend in the third direction III through the gate structure GST. The first channel structure CH1 and the second channel structure CH2 may be adjacent to each other in the second direction II. A pair of the first channel structure CH1 and the second channel structure CH2 adjacent to each other in the second direction II may be located in one channel hole CHH.

The first slit structure SL1 may be located in the gate structure GST. In a cross section defined by the first direction I and the third direction III, the first slit structure SL1 may extend in the third direction III through the gate structure GST. In the plane defined by the first direction I and the second direction II, the first slit structure SL1 may extend between the first channel structure CH1 and the second channel structure CH2, and extend in the first direction I. The first channel structure CH1 and the second channel structure CH2 may be isolated from each other by the first slit structure SL1. The drain select lines DSL0 to DSL8 may be isolated from one another by the first slit structure SL1.

The first channel structure CH1 may include a first channel layer 15A, a first memory layer 14A, a first insulating core 16A, or a combination thereof. The second channel structure CH2 may include a second channel layer 15B, a second memory layer 14B, a second insulating core 16B, or a combination thereof. The first memory layer 14A and the second memory layer 14B may each include a blocking layer, a data storage layer, a tunneling layer, or a combination thereof. The data storage layer may include a floating gate, polysilicon, a charge trap material, nitride, a variable resistance material, or a combination thereof.

A first source select transistor, a first memory cell, or a first drain select transistor may be located in a region where the first channel structure CH1 and the conductive layers 11 intersect each other. At least one first source select transistor, a plurality of first memory cells, and at least one first drain select transistor may be stacked along the first channel structure CH1. The least one first source select transistor, the plurality of first memory cells, and the at least one first drain select transistor may constitute a first memory string MS1.

A second source select transistor, a second memory cell, or a second drain select transistor may be located in a region where the second channel structure CH2 and the conductive layers 11 intersect each other. At least one second source select transistor, a plurality of second memory cells, and at least one second drain select transistor may be stacked along the second channel structure CH2. The least one second source select transistor, the second memory cells, and the at least one second drain select transistor may constitute a second memory string MS2.

The first memory string MS1 and the second memory string MS2 may be different in sizes from each other. The size may be an area occupied by each of the memory strings MS1 and MS2 in the plane defined by the first direction I and the second direction II. The size of the first memory string MS1 may be an area of the first memory string MS1 in the plane. The size of the second memory string MS2 may be an area of the second memory string MS2 in the plane. As an example, the size of the first memory string MS1 may be an area of the first channel layer 15A, and the size of the second memory string MS2 may be an area of the second channel layer 15B. In the plane defined by the first direction I and the second direction II, the first memory string MS1 may have a first size and the second memory string MS2 may have a second size larger than the first size. The area of the first channel layer 15A in the first memory string MS1 may be larger than the area of the second channel layer 15B in the second memory string MS2.

The first memory string MS1 and the second memory string MS2 may be located in one channel hole CHH. As an example, the size of the first memory string MS1 may be an area occupied by the first memory string MS1 in the channel hole CHH. In the plane, an area occupied by the first channel layer 15A, the first memory layer 14A, and the first insulating core 16A may be the size of the first memory string MS1. The size of the second memory string MS2 may be an area occupied by the second memory string MS2 in the channel hole CHH.

In the plane, an area occupied by the second channel layer 15B, the second memory layer 14B, and the second insulating core 16B may be the size of the second memory string MS2. In the plane, the second memory string MS2 may have a larger size than the first memory string MS1.

A difference in size between the first memory string MS1 and the second memory string MS2 may be caused in a manufacturing process. A pair of the first memory string MS1 and the second memory string MS2 may be formed in one channel hole CHH in the manufacturing process. As an example, a channel structure may be formed in the channel hole CHH and then may be cut by the first slit structures SL1 to form the first channel structure CH1 and the second channel structure CH2. In such a case, as the position of a mask pattern for cutting the channel structure is shifted from a target position, the channel structure may be asymmetrically cut. In FIG. 1A, 'S' denotes the shift of the position of the mask pattern. The first channel structure CH1 and the second channel structure CH2 may have different sizes due to the asymmetrical cutting, so that the first memory string MS1 and the second memory string MS2 may have different sizes. The memory strings MS1 and MS2 respectively located in different channel holes CHH may have different sizes.

According to the structure described above, the degree of integration of a semiconductor device can be improved by forming a plurality of memory strings in one channel hole. The sizes of the first memory string MS1 and the second memory string MS2 may be different from each other according a cut position of a channel structure, so that the first memory string MS1 and the second memory string MS2 may have different characteristics. During a read operation, a current flowing through a channel layer may be referred to as a cell current, and the amount of the cell current may have an influence on the characteristics of a memory string. The amount of the cell current may vary depending on an area of a channel layer. The amount of a cell current flowing through the second channel layer 15B in the second memory string MS2 having a large size may be greater than the amount of a cell current flowing through the first channel layer 15A in the first memory string MS1 having a small size. Accordingly, a read operation may be dualized in consideration of the sizes of the first memory string MS1 and the second memory string MS2. As an example, a sensing operation of a page buffer may be dualized.

Figure 2:
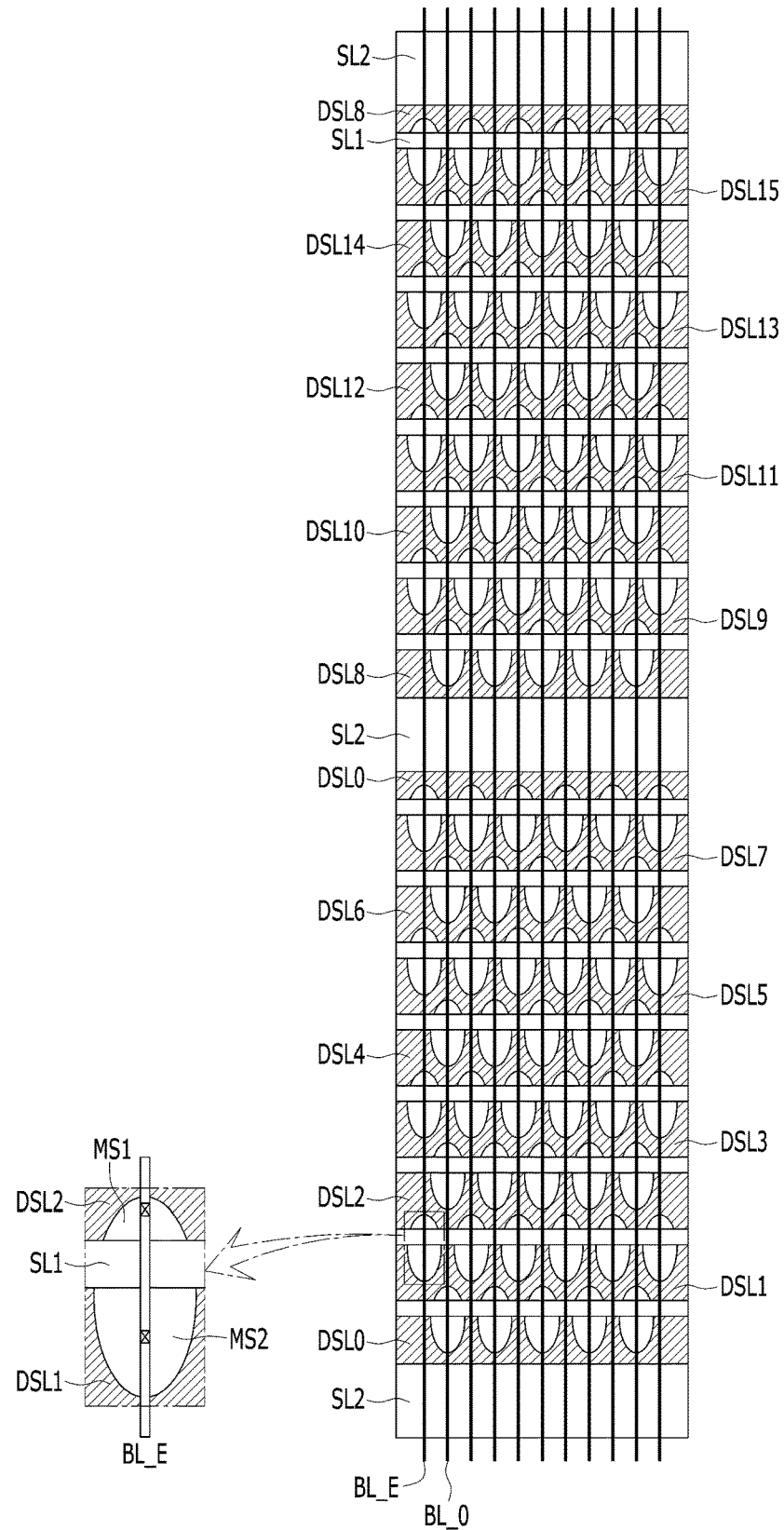
FIG. 2 is a diagram for describing a structure of the semiconductor device in accordance with an embodiment of the present disclosure.

FIG. 2 is a diagram for describing the structure of the semiconductor device in accordance with an embodiment of the present disclosure. Hereinafter, the descriptions for the components described above in accordance with FIGS. 1A and 1B will be omitted.

Referring to FIG. 2, the semiconductor device may further include the memory strings MS1 and MS2 and bit lines BL_E and BL_O. The memory strings MS1 and MS2 having different sizes may be connected to one bit line BL_E or BL_O. As an example, each of the even bit lines BL_E may be connected to the first memory string MS1 and the second memory string MS2. Each of the odd bit lines BL_O may be connected to the first memory string MS1 and the second memory string MS2. The second memory string MS2 may have a larger size than the first memory string MS1.

The connections between the memory strings MS1 and MS2 and the bit lines BL_E and BL_O may be controlled through drain select lines DSL0 to DSL15. When the drain select lines DSL0, DSL2, DSL4, DSL6, DSL8, DSL10, DSL12, and DSL14 are selected, the even bit line BL_E may be connected to the first memory string MS1 and the odd bit line BL_O may be connected to the second memory string MS2. When the drain select lines DSL1, DSL3, DSL5, DSL7, DSL9, DSL11, DSL13, and DSL15 are selected, the even bit line BL_E may be connected to the second memory string MS2 and the odd bit line BL_O may be connected to the first memory string MS1.

According to the structure described above, the first memory string MS1 and the second memory string MS2 having different sizes can be controlled in different ways.

Figure 3:
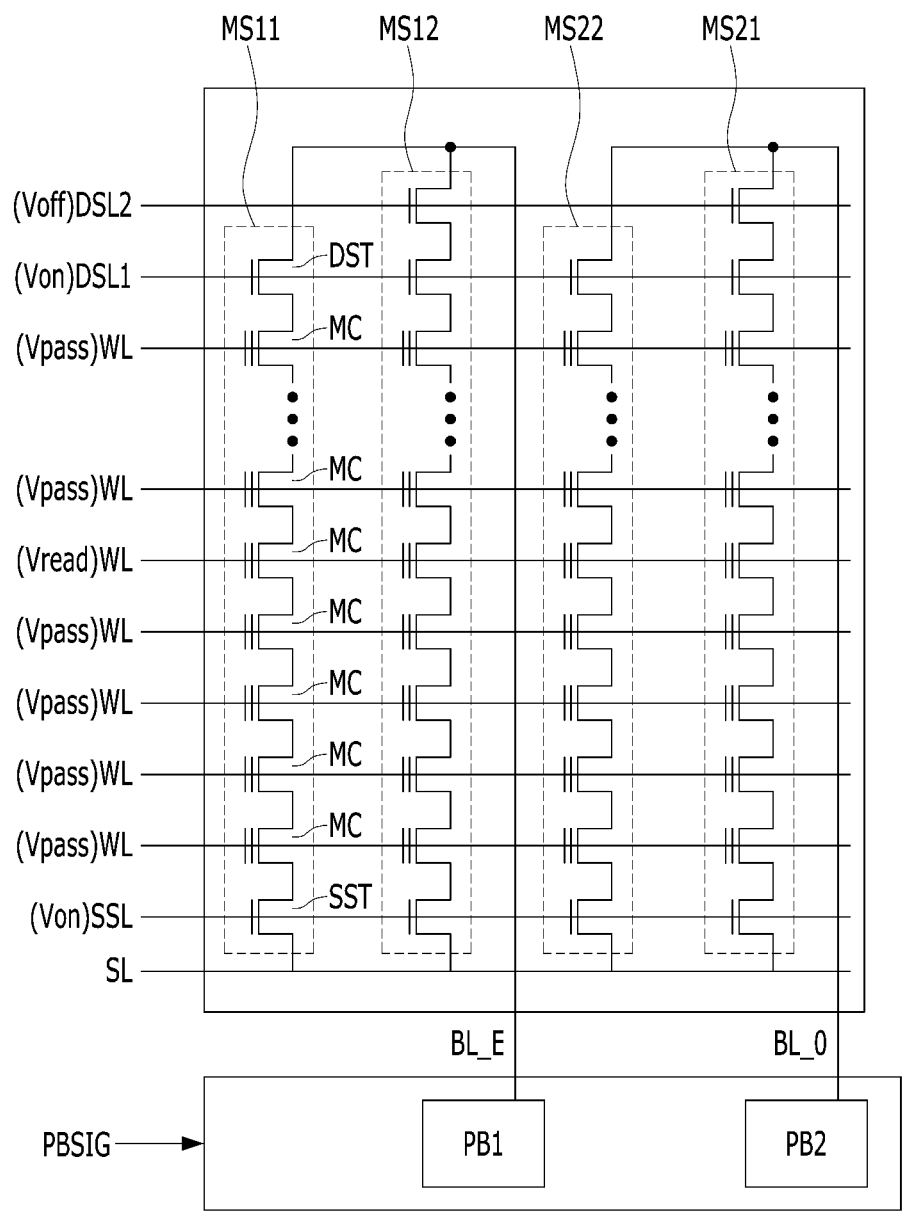
FIG. 3 is a diagram illustrating a semiconductor device in accordance with an embodiment of the present disclosure.

FIG. 3 is a diagram illustrating a semiconductor device in accordance with an embodiment of the present disclosure.

Referring to FIG. 3, a first memory string MS11 and a second memory string MS12 may be connected to an even bit line BL_E. A first memory string MS21 and a second memory string MS22 may be connected to an odd bit line BL_O. The memory strings MS11 and MS12 may be connected between the even bit lines BL_E and a source line SL. The memory strings MS21 and MS22 may be connected between the odd bit lines BL_O and the source line SL. Each of the memory strings MS11, MS12, MS21, and MS22 may include at least one drain select transistor DST, a plurality of memory cells MC, and at least one source select transistor SST.

The second memory strings MS12 and MS22 may have larger sizes than the first memory strings MS11 and MS21. The drain select transistors DST in the second memory strings MS12 and MS22 may be larger in sizes than the drain select transistors DST in the first memory strings MS11 and MS21. The memory cells MC in the second memory strings MS12 and MS22 may be larger in sizes than the memory cells MC in the first memory strings MS11 and MS21. The source select transistors SST in the second memory strings MS12 and MS22 may be larger in sizes than the source select transistors SST in the first memory strings MS11 and MS21.

The even bit line BL_E may be connected to a first page buffer PB1 and the odd bit line BL_O may be connected to a second page buffer PB2. In response to a page buffer control signal PBSIG, the first page buffer PB1 may sense a voltage or current level of the even bit line BL_E and the second page buffer PB2 may sense a voltage or current level of the odd bit line BL_O.

Hereinafter, a sensing operation of a page buffer, which is performed during a read operation and dualized (i.e., differently controlled) according to sizes of memory strings will be described. The read operation may be a general read operation or a verification operation accompanying a program operation or an erase operation.

The sensing operation of the page buffer may include a precharge period, an evaluation period, and a data storage period. During the precharge period, the first page buffer PB1 and the second page buffer PB2 may precharge the even bit line BL_E and the odd bit line BL_O in response to the page buffer control signals PBSIG.

For example, during the evaluation period, the bit line BL_E and a sensing node may be connected to each other in a state in which a read voltage Vread is applied to a selected memory cell MC of a selected memory string MS11 and a pass voltage Vpass is applied to unselected memory cells MC.

The read voltage Vread may be applied to a selected word line WL and the pass voltage Vpass may be applied to unselected word lines WL. The read voltage Vread may have a level for turning on or off a memory cell according to data written in the memory cell. The pass voltage Vpass may have a level for turning on a memory cell regardless of data written in the memory cell.

A turn-on voltage Von may be applied to a selected first drain select line DSL1 so that the even bit line BL_E and the first memory string MS11 may be connected to each other, and the odd bit line BL_O and the second memory string MS22 may be connected to each other. A turn-off voltage Voff may be applied to an unselected second drain select line DSL2. When the second drain select line DSL2 is selected, the even bit line BL_E and the second memory string MS12 may be connected to each other, and the odd bit line BL_O and the first memory string MS21 may be connected to each other. Voltage levels of the even bit line BL_E and the odd bit line BL_O may be maintained or lowered according to threshold voltages of memory cells connected to the selected word line WL.

During the evaluation period, the first page buffer PB1 may sense a voltage or current level of the even bit line BL_E and the second page buffer PB2 may sense a voltage or current level of the odd bit line BL_O. The even bit line BL_E and a sensing node of the first page buffer PB1 may be connected to each other, and a voltage level of the sensing node may be maintained or lowered according to a voltage level of the even bit line BL_E. The odd bit line BL_O and a sensing node of the second page buffer PB2 may be connected to each other, and a voltage level of the sensing node may be maintained or lowered according to a voltage level of the odd bit line BL_O.

The first page buffer PB1 and the second page buffer PB2 may change a method of sensing the voltage or current level of the even bit line BL_E and the odd bit line BL_O according to a size of a selected memory string. That is, the sensing node of the selected page buffer may be charged by using different methods based on a size of a memory string selected among the memory strings.

As an example, resistance of a current path between the sensing node and the selected memory strings MS11 and MS12 may be changed. Since the cell current is small when the size of the selected memory string MS11 is small, the resistance of the current path may be decreased. Further, since the cell current is large when the size of the selected memory string MS12 is large, the resistance of the current path may be increased. When the size of a selected memory string is small, the length of the evaluation period may be increased, and when the size of the selected memory string is large, the length of the evaluation period may be decreased.

According to the method described above, even though sizes of memory strings are different from each other, the difference in characteristics such as a cell current can be improved by changing evaluation conditions. As an example, the difference in characteristics of a memory string can be compensated for by changing resistance of a current path between a bit line and a sensing node or changing the length of an evaluation period.

The sizes of memory strings may be determined in a manufacturing process, and information on the sizes of the memory strings and sensing methods may be stored in a semiconductor device. The sensing methods, the evaluation conditions, and the like may be adjusted in units of memory blocks or in units of memory planes. As an example, a table in which the sensing methods, the evaluation conditions, and the like are matched in units of memory blocks may be used.

Figure 4:
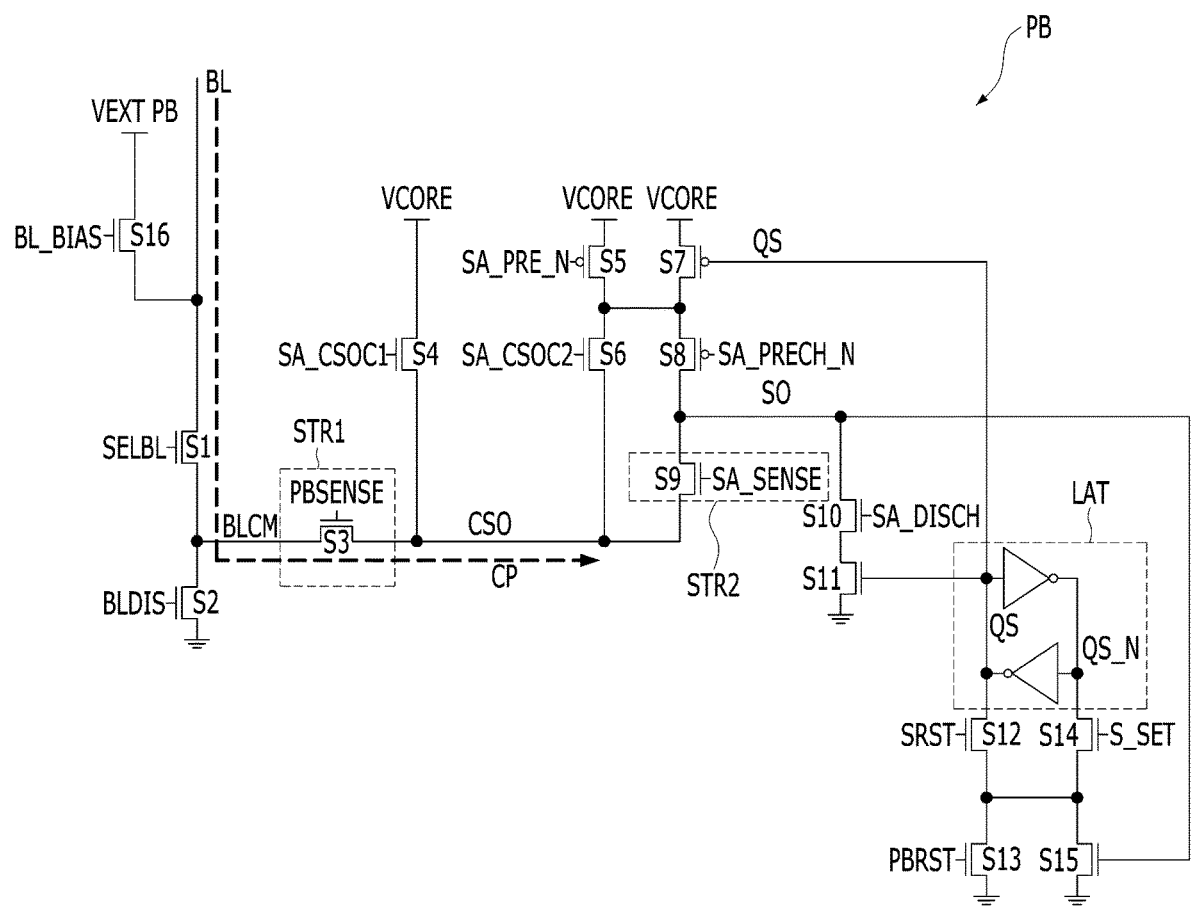
FIG. 4 and FIG. 5 are diagrams for describing an operation of a page buffer included in a semiconductor device in accordance with an embodiment of the present disclosure.

FIG. 4 is a diagram for describing an operation of a page buffer PB included in a semiconductor device in accordance with an embodiment of the present disclosure.

Referring to FIG. 4, the page buffer PB may include first to sixteenth switches S1 to S16 and at least one latch LAT. Each of the first to sixteenth switches S1 to S16 may include an NMOS transistor or a PMOS transistor. The latch LAT may include cross-coupled inverters. The page buffer PB may include a bit line connection node BLCM, a first sensing node CSO, and a second sensing node SO. Hereinafter, a sensing method of the page buffer will be described based on signals applied to the first to sixteenth switches S1 to S16.

The first switch S1 may be turned on or off in response to a bit line selection signal SELBL. The bit line selection signal SELBL may be one of page buffer control signals PBSIG shown in FIG. 3. When the first switch S1 is turned on, a voltage of the bit line connection node BLCM may be transferred to a bit line BL, or the voltage or current level of the bit line BL may be transferred to the bit line connection node BLCM.

The second switch S2 may connect or disconnect the bit line connection node BLCM to/from a ground terminal in response to a bit line discharge signal BLDIS. The bit line discharge signal BLDIS may be one of the page buffer control signals PBSIG. When the second switch S2 is turned on, the bit line connection node BLCM may be connected to the ground terminal and may be discharged.

The third switch S3 may connect or disconnect the bit line connection node BLCM to/from the first sensing node CSO in response to a page buffer sensing signal PBSENSE. The page buffer sensing signal PBSENSE may be one of the page buffer control signals PBSIG. The third switch S3 may be referred to as a first sensing transistor STR1. When the first switch S1 and the third switch S3 are turned on, a current path CP may be formed between the bit line BL and the first sensing node CSO.

The fourth switch S4 may connect or disconnect the first sensing node CSO to/from a core voltage terminal VCORE in response to a first common sensing control signal SA_CSOC1. The fifth switch S5 and the sixth switch S6 may connect the first sensing node CSO to the core voltage terminal VCORE in response to a first precharge signal SA_PRE_N and a second common sensing control signal SA_CSOC2, respectively. The seventh switch S7 may be controlled according to the potential of a first latching node QS. The eighth switch S8 may be controlled in response to a second precharge signal SA_PRECH_N. Each of the first common sensing control signal SA_CSOC1, the first precharge signal SA_PRE_N, the second common sensing control signal SA_CSOC2, and the second precharge signal SA_PRECH_N may be one of the page buffer control signals PBSIG.

The ninth switch S9 may be connected between the first sensing node CSO and the second sensing node SO. The ninth switch S9 may connect or disconnect the first sensing node CSO to/from the second sensing node SO in response to a sensing signal SA_SENSE. The ninth switch S9 may be referred to as a second sensing transistor STR2. The sensing signal SA_SENSE may be one of the page buffer control signals PBSIG.

The tenth switch S10 may be turned on or off in response to a sensing node discharge signal SA_DIS. The eleventh switch S11 may be turned on or off according to data stored in the first latching node QS. When the tenth switch S10 and the eleventh switch S11 are turned on, the second sensing node SO may be connected to the ground terminal and may be discharged.

The latch LAT may temporarily store data sensed through the bit line BL. Main data may be stored in the first latching node QS, and inverted data of the main data may be stored in a second latching node QS_N.

The twelfth switch S12 may be controlled in response to a sensing reset signal SRST. The thirteenth switch S13 may be controlled in response to a page buffer reset signal PBRST. The fourteenth switch S14 may be controlled in response to a sensing set signal S_SET. The fifteenth switch S15 may be controlled in response to a voltage level of the second sensing node SO. The magnitude of the voltage level of the second sensing node SO may vary depending on a result of sensing a selected memory cell.

The sixteenth switch S16 may be controlled in response to a bit line bias signal BL_BIAS. When the sixteenth switch S16 is turned on, an external voltage may be transferred from an external voltage terminal VEXT_PB to the bit line BL.

A sensing operation based on the configuration of the page buffer PB described above is as follows. In a precharge period, the bit line BL may be precharged. The external voltage or a core voltage may be used as a precharge voltage. As an example, the bit line BL may be precharged with the external voltage by turning on the sixteenth switch S16. During the precharge period, the first sensing node CSO and the second sensing node SO may be precharged. Further, the first sensing node CSO and the second sensing node SO may be precharged with the core voltage by turning on the fifth switch S5, the eighth switch S8, and the ninth switch S9.

In an evaluation period, the bit line BL and the sensing nodes may be connected in a state in which a read voltage Vread is applied to a selected word line and a pass voltage Vpass is applied to unselected word lines. The bit line BL and the sensing nodes may be electrically connected by turning on the sensing transistors. As an example, the bit line BL and the first sensing node CSO may be electrically connected by turning on the first sensing transistor STR1. The bit line BL and the second sensing node SO may be electrically connected by turning on the first sensing transistor STR1 and the second sensing transistor STR2.

When the bit line BL and the second sensing node SO is electrically connected, a current path CP may be formed between the bit line BL and the second sensing node SO. The resistance of the current path CP may be changed according to the size of a selected memory string. As an example, memory strings may each have a first size or a second size larger than the first size. The resistance of the current path CP may be changed by confirming the size of the selected memory string and changing a turn-on voltage of at least one of the first sensing transistor STR1 and the second sensing transistor STR2.

As an example, the level of the page buffer sensing signal PBSENSE applied to the first sensing transistor STR1 may be changed. After confirming that a selected memory string has the first size, a turn-on voltage having a first level may be applied to the first sensing transistor STR1. The resistance of the current path CP may be reduced by increasing the turn-on level of the page buffer sensing signal PBSENSE, and accordingly the amount of the current flowing through the current path CP may be increased. After confirming that the selected memory string has the second size, a turn-on voltage having a second level lower than the first level may be applied to the first sensing transistor STR1. The resistance of the current path CP may be increased by decreasing the turn-on level of the page buffer sensing signal PBSENSE, and accordingly the amount of the current flowing through the current path CP may be reduced.

As an example, the level of the sensing signal SA_SENSE applied to the second sensing transistor STR2 may be changed. After confirming that a selected memory string has the first size, a turn-on voltage having a first level may be applied to the second sensing transistor STR2. The resistance of the current path CP may be reduced by increasing the turn-on level of the sensing signal SA_SENSE, and accordingly the amount of the current flowing through the current path CP may be increased. After confirming that the selected memory string has the second size, a turn-on voltage having a second level lower than the first level may be applied to the second sensing transistor STR2. The resistance of the current path CP may be increased by decreasing the turn-on level of the sensing signal SA_SENSE, and accordingly the amount of the current flowing through the current path CP may be reduced.

According to the operation method described above, the resistance of the current path CP formed between a bit line and a sensing node may be adjusted in an evaluation period according to the size of a selected memory string. Accordingly, even though the amount of cell current varies according to a difference in size between memory strings, the difference in the amount of cell current may be compensated for by changing the resistance of the current path CP.

Figure 5:
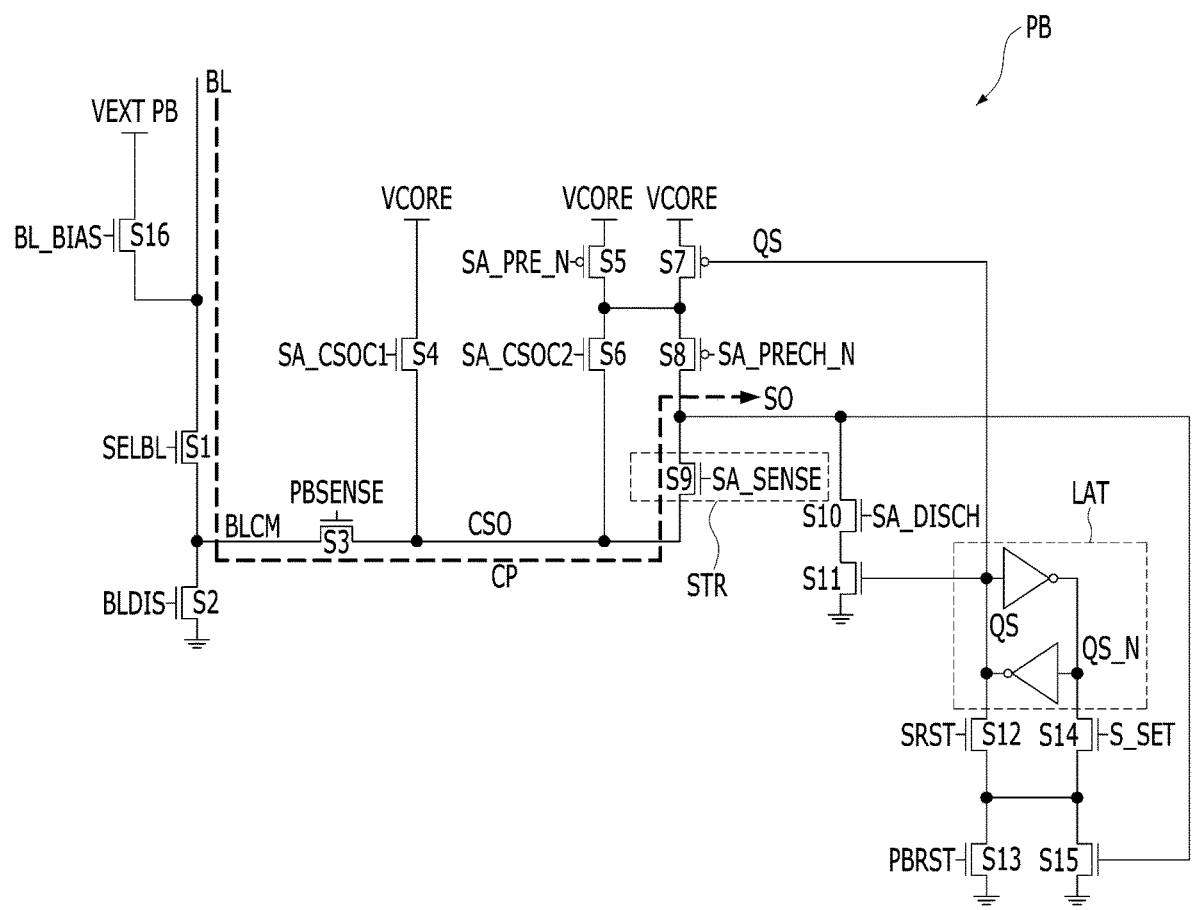

FIG. 5 is a diagram for an operation of a page buffer PB included in a semiconductor device in accordance with an embodiment of the present disclosure.

Referring to FIG. 5, the page buffer PB may include the first to sixteenth switches S1 to S16 and the latch LAT. The page buffer PB may include the bit line connection node BLCM, the first sensing node CSO, and the second sensing node SO. Hereinafter, the descriptions for the components described above in accordance with FIG. 4 will be omitted.

During the evaluation period, the bit line BL and the second sensing node SO may be connected in a state in which the read voltage Vread is applied to a selected word line and the pass voltage Vpass is applied to unselected word lines. The ninth switch S9 may be referred to as a sensing transistor STR that connects the bit line BL and the second sensing node SO in response to the sensing signal SA_SENSE. As an example, during a read operation, the third switch S3 may be kept turned on, and the ninth switch S9 may be turned on to form a current path CP from the bit line BL to the second sensing node SO.

The length of the evaluation period may vary depending on the size of a memory string. By changing a control method of the sensing transistor STR, the length of the evaluation period may be changed according to the size of the selected memory string. As an example, the turn-off point in time of the sensing transistor STR may be changed according to the size of a selected memory string. When the size of the selected memory string is small, the evaluation period may have a first length. When the size of the selected memory string is large, the evaluation period may have a second length shorter than the first length.

As an example, when the size of the selected memory string is small, the length of the evaluation period may be increased by delaying the turn-off point in time of the sensing transistor STR. When the size of the selected memory string is large, the length of the evaluation period may be reduced by advancing the turn-off point in time of the sensing transistor STR.

According to the operation method described above, the length of an evaluation period may be adjusted according to the size of a selected memory string. Accordingly, even though the amount of cell current varies depending on the size of a memory string, the difference in the amount of cell current may be compensated for by changing the length of the evaluation period.

Figure 6:
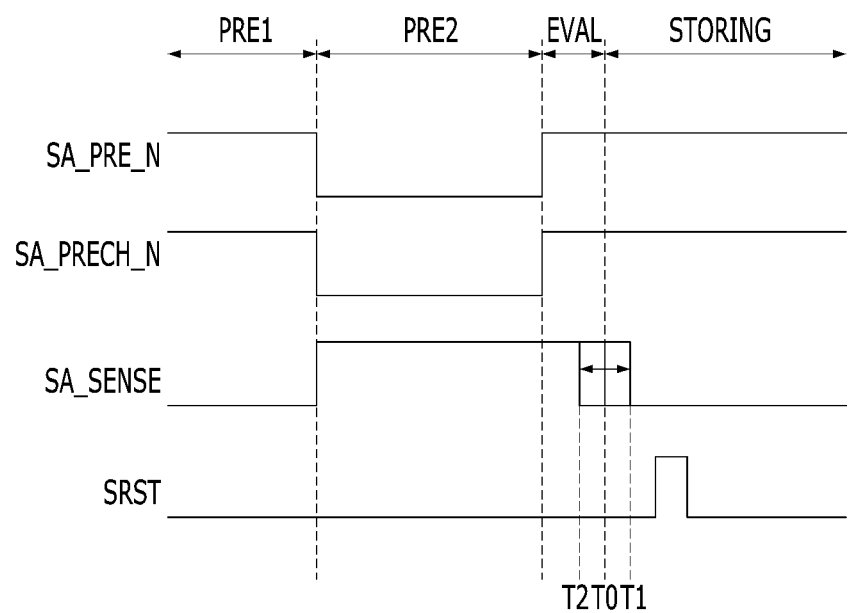
FIG. 6 is a timing diagram for describing an operation of a page buffer included in a semiconductor device in accordance with an embodiment of the present disclosure.

FIG. 6 is a timing diagram for describing an operation of a page buffer PB included in a semiconductor device in accordance with an embodiment of the present disclosure.

Referring to FIG. 5 and FIG. 6, the sensing operation of the page buffer may include a first precharge period PRE1, a second precharge period PRE2, an evaluation period EVAL, and a data storage period STORING.

During the first precharge period PRE1, the bit line BL may be precharged. As an example, the first precharge signal SA_PRE_N having a high level may be applied to the fifth switch S5, the second precharge signal SA_PRECH_N having a high level may be applied to the eighth switch S8, and the sensing signal SA_SENSE having a low level may be applied to the ninth switch S9. Accordingly, the fifth switch S5, the eighth switch S8, and the ninth switch S9 may be turned off. The bit line bias signal BL_BIAS having a high level may be applied to the sixteenth switch S16, and the sixteenth switch S16 may be turned on so that the bit line BL may be precharged with the external voltage.

During the second precharge period PRE2, the first sensing node CSO and the second sensing node SO may be precharged. As an example, the first precharge signal SA_PRE_N having a low level may be applied to the fifth switch S5, the second precharge signal SA_PRECH_N having a low level may be applied to the eighth switch S8, and the sensing signal SA_SENSE having a high level may be applied to the ninth switch S9. Accordingly, the fifth switch S5, the eighth switch S8, and the ninth switch S9 may be turned on, and the first sensing node CSO and the second sensing node SO may be precharged with the core voltage.

During the evaluation period EVAL, the bit line BL and the first sensing node CSO may be connected. As an example, the bit line selection signal SELBL having a high level may be applied to the first switch S1 and the page buffer sensing signal PBSENSE having a high level may be applied to the third switch S3. Accordingly, the first switch S1 and the third switch S3 may be turned on, and the bit line BL and the first sensing node CSO may be connected. As an example, the first precharge signal SA_PRE_N having a high level may be applied to the fifth switch S5, and the second precharge signal SA_PRECH_N having a high level may be applied to the eighth switch S8. Accordingly, the fifth switch S5 and the eighth switch S8 may be turned off. The sensing signal SA_SENSE having a high level may be applied to the ninth switch S9. Accordingly, the ninth switch S9 may be turned on, and the first sensing node CSO and the second sensing node SO may be connected. As a result, a current path CP passing through the first switch S1, the third switch S3, and the ninth switch S9 may be formed.

During the evaluation period EVAL, the voltage of the first sensing node CSO may be changed or maintained according to a threshold voltage of a selected memory cell connected to the bit line BL. When the threshold voltage of the selected memory cell is lower than the read voltage, the selected memory cell may be turned on, and a current path CP through the bit line BL may be formed, so that the voltage of the second sensing node SO may be lowered. When the threshold voltage of the selected memory cell is higher than the read voltage, the selected memory cell may be turned off, no current path CP through the bit line BL may be formed, and the voltage of the second sensing node SO may be maintained. When the sensing signal SA_SENSE having a high level transitions to a low level, the sensing transistor STR may be turned off and the evaluation period EVAL may end.

The length of the evaluation period EVAL may be changed according to the size of a selected memory string. As an example, when the sizes of a first memory string and a second memory string formed in one channel hole are substantially identical to each other, the sensing transistor STR may be turned off at a $0^{th}$ point in time T0 and the evaluation period EVAL may end. When the sizes of the first memory string and the second memory string formed in one channel hole are different from each other, the turn-off point in time of the sensing transistor may be changed.

As an example, when the first memory string having a small size and the sensing node are connected to each other, the length of the evaluation period EVAL may be increased so that the current path CP through the bit line BL may be sufficiently formed. The sensing transistor STR may be turned off at a first point in time T1 delayed more than the $0^{th}$ point in time T0. The length of the evaluation period EVAL may be increased by delaying the turn-off point in time, and current may sufficiently flow through the current path CP.

As an example, when the second memory string having a large size and the sensing node are connected to each other, the length of the evaluation period EVAL may be reduced so that the amount of a current flowing through the current path CP is reduced. The sensing transistor STR may be turned off at a second point in time T2 earlier than the $0^{th}$ point in time T0. By advancing the turn-off point in time, the length of the evaluation period EVAL may be reduced and the amount of the current flowing through the current path CP may be reduced.

During the data storage period STORING, a result of sensing the selected memory cell may be stored in the latch LAT. The voltage level of the second sensing node SO may be maintained or lowered according to the voltage level of the selected memory cell connected to the bit line BL. The fifteenth switch S15 may be turned on or off in response to the voltage level of the second sensing node SO. The twelfth switch S12 may be controlled in response to the sensing reset signal SRST. When the twelfth switch S12 and the fifteenth switch S15 are turned on, a current path CP may be formed to the ground, so that the value of the first latching node QS may be inverted. Accordingly, the second latching node QS_N may also be inverted.

According to the operation as described above, the length of the evaluation period EVAL may be changed according to the size of a selected memory string. When the size of the selected memory string is small, the sensing transistor STR may be turned off at the first point in time T1. Further, when the size of the selected memory string is large, the sensing transistor STR may be turned off at the second point in time T2 earlier than the first point in time T1. Accordingly, the difference in the amount of cell current due to the sizes of memory strings may be compensated for, thereby making it possible to improve the sensing operation of a page buffer.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:
    a bit line;
    memory strings connected to the bit line and having different sizes;
    a page buffer including at least a sensing node and a sensing transistor configured to couple the bit line and the sensing node in response to a sensing signal,
    wherein, during an evaluation period of the page buffer, resistance of a current path formed from the bit line to the sensing node is adjusted based on a size of a memory string selected among the memory strings.

2. The semiconductor device of claim 1, wherein a turn-on voltage of the sensing transistor is adjusted according to the size of the selected memory string.

3. The semiconductor device of claim 1, wherein the memory strings include a first memory string having a first size and a second memory string having a second size larger than the first size.

4. The semiconductor device of claim 3, wherein, during the evaluation period of the page buffer, the first memory string and the sensing node are electrically connected to each other by applying a turn-on voltage having a first level to the sensing transistor.

5. The semiconductor device of claim 4, wherein, during the evaluation period of the page buffer, the second memory string and the sensing node are electrically connected to each other by applying a turn-on voltage having a second level lower than the first level to the sensing transistor.

6. A semiconductor device comprising:
    a bit line;
    memory strings connected to the bit line and having different sizes;
    a page buffer including at least a sensing node and a sensing transistor configured to electrically connect the bit line and the sensing node in response to a sensing signal,
    wherein a length of an evaluation period of the page buffer, in which the bit line and the sensing node are connected to each other, is adjusted based on a size of a memory string selected among the memory strings.

7. The semiconductor device of claim 6, wherein the memory strings include a first memory string having a first size and a second memory string having a second size larger than the first size.

8. The semiconductor device of claim 7, wherein the first memory string and the sensing node are electrically connected to each other during the evaluation period of the page buffer, and the evaluation period of the page buffer has a first length.

9. The semiconductor device of claim 8, wherein the second memory string and the sensing node are electrically connected to each other during the evaluation period of the page buffer, and the evaluation period of the page buffer has a second length shorter than the first length.

10. The semiconductor device of claim 7, wherein the first memory string and the sensing node are electrically connected to each other during the evaluation period of page buffer, and the evaluation period of the page buffer ends by turning off the sensing transistor at a first point in time.

11. The semiconductor device of claim 10, wherein the second memory string and the sensing node are electrically connected to each other during the evaluation period of the page buffer, and the evaluation period of the page buffer ends by turning off the sensing transistor at a second point in time earlier than the first point in time.

12. An operating method of a semiconductor device, the operating method comprising:
applying a read voltage to a selected word line;
applying a pass voltage to unselected word lines; and
turning on a sensing transistor, during an evaluation period of a page buffer, to electrically connect a sensing node and a memory string selected among memory strings connected to a bit line,
wherein a turn-on voltage of the sensing transistor is adjusted based on a size of the selected memory string.

13. The operating method of claim 12, wherein, during the evaluation period of the page buffer, a turn-on voltage having a first level is applied to the sensing transistor when the selected memory string has a first size.

14. The operating method of claim 13, wherein, during the evaluation period of the page buffer, a turn-on voltage having a second level lower than the first level is applied to the sensing transistor when the selected memory string has a second size larger than the first size.

15. An operating method of a semiconductor device, the operating method comprising:
applying a read voltage to a selected word line;
applying a pass voltage to unselected word lines; and
turning on a sensing transistor, during an evaluation period of a page buffer, to connect a sensing node and a memory string selected among memory strings connected to a bit line,
wherein a turn-off point in time of the sensing transistor is adjusted based on a size of the selected memory string.

16. The operating method of claim 15, wherein, when the selected memory string has a first size, the evaluation period of the page buffer ends by turning off the sensing transistor at a first point in time.

17. The operating method of claim 16, wherein, when the selected memory string has a second size larger than the first size, the evaluation period of the page buffer ends by turning off the sensing transistor at a second point in time earlier than the first point in time.

18. A semiconductor device comprising:
a bit line;
memory strings connected to the bit line and having different sizes;
a page buffer including at least a sensing node and a sensing transistor configured to couple the bit line and the sensing node in response to a sensing signal,
wherein, during an evaluation period of the page buffer, in which a current path is formed from the bit line to the sensing node, the sensing node is charged by using different methods based on a size of a memory string selected among the memory strings.

19. The semiconductor device of claim 18,
wherein the memory strings include a first memory string having a first size and a second memory string having a second size larger than the first size, and
wherein, during the evaluation period of the page buffer, the first memory string and the sensing node are electrically connected to each other by applying a turn-on voltage having a first level to the sensing transistor; or the second memory string and the sensing node are electrically connected to each other by applying a turn-on voltage having a second level lower than the first level to the sensing transistor.

20. The semiconductor device of claim 18,
wherein the memory strings include a first memory string having a first size and a second memory string having a second size larger than the first size, and
wherein, when the first memory string and the sensing node are electrically connected to each other during the evaluation period of the page buffer, the evaluation period of the page buffer has a first length; and when the second memory string and the sensing node are electrically connected to each other during the evaluation period of the page buffer, the evaluation period of the page buffer has a second length shorter than the first length.

* * * * *